(12) United States Patent
Azin

(10) Patent No.: US 9,473,127 B1
(45) Date of Patent: Oct. 18, 2016

(54) INPUT/OUTPUT (I/O) DRIVER

(71) Applicant: QUALCOMM Incorporated, San Diego, CA (US)

(72) Inventor: Meysam Azin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/792,361

(22) Filed: Jul. 6, 2015

(51) Int. Cl.
| H03K 3/00 | (2006.01) |
| H03K 5/04 | (2006.01) |
| H03K 19/0185 | (2006.01) |
| H03K 19/00 | (2006.01) |

(52) U.S. Cl.
CPC ............ *H03K 5/04* (2013.01); *H03K 19/0016* (2013.01); *H03K 19/018507* (2013.01)

(58) Field of Classification Search
None
See application file for complete search history.

(56) References Cited

U.S. PATENT DOCUMENTS

| 4,622,482 A * | 11/1986 | Ganger ................ H03K 17/163 327/410 |
| 5,949,259 A * | 9/1999 | Garcia ................... H03F 3/3001 327/112 |
| 5,959,482 A | 9/1999 | Fattori et al. |
| 5,973,512 A | 10/1999 | Baker |
| 6,606,271 B2 | 8/2003 | Hunt |
| 7,471,111 B2 * | 12/2008 | Seth ................. H03K 19/01721 326/83 |
| 7,859,314 B2 | 12/2010 | Rutkowski et al. |
| 7,924,066 B2 * | 4/2011 | Gagne ................ H03K 19/0008 327/108 |
| 8,536,913 B2 | 9/2013 | Chen et al. |
| 8,638,131 B2 | 1/2014 | Chen et al. |
| 2010/0244907 A1 * | 9/2010 | Gagne ................ H03K 19/0008 327/109 |

* cited by examiner

Primary Examiner — Long Nguyen
(74) Attorney, Agent, or Firm — Loza & Loza LLP

(57) ABSTRACT

An I/O driver and related method are provided herein. The I/O driver includes circuitry for expediting the configuring of the corresponding output FET to operate in the linear region to reduce delay between the transition of the input signal and the corresponding transition of the output signal. Additionally, the I/O driver includes circuitry for controlling the slew rate at which the output signal transitions from a low logic state to a high logic state, or vice-versa. Further, the I.O driver includes circuitry for turning off the turned-on output FET before turning on the other output FET. This prevents "shoot-thru" current from flowing through the output FETs to reduce power consumption associated with the I/O driver.

30 Claims, 6 Drawing Sheets

INPUT/OUTPUT (I/O) DRIVER

BACKGROUND

1. Field

Aspects of the present disclosure relate generally to input/output (I/O) drivers, and more particularly, to an I/O driver with low delay, controlled slew rate, low power, and low jitter.

2. Background

Input/Output (I/O) drivers are typically employed at edges of an integrated circuit (IC) to output a signal or voltage Vo based on an input signal Do generated internally within the IC. The I/O driver configures the output signal or voltage Vo suitable for transmission to another IC or device. Characteristics of I/O drivers that are generally desirable include low power consumption, controlled slew rate, low delay, and low jitter.

Generally, a low power consumption device is desirable, especially in products that employ a battery as their power source. The lower power consumption generally prolongs battery life between consecutive recharges of the battery.

Slew rate control is also generally desirable for accurate operations downstream, for controlling or minimizing electromagnetic interference (EMI), and for preventing or reducing unwanted signal reflections off of transmission lines. The slew rate is generally the rate or slope at which the output voltage Vo of an I/O driver transitions from a low logic state to a high logic state, and vice-versa. An I/O driver that has a poor slew rate control typically has a slew rate that varies with its output load. For instance, if the output load has a relatively large effective capacitance, the slew rate is typically relatively low. On the other hand, if the output load has a relatively small effective capacitance, the slew rate is typically relatively high.

A varying slew rate may adversely affect operation of one or more devices that use the output signal of an I/O driver. For instance, often in digital circuits, timing of certain operations depends on the rising and/or falling edges of a signal. If such rising and/or falling edges of a signal generated by an I/O driver are allowed to vary due to different loads applied to the output of the I/O driver, the operation of one or more devices that use such signal may be adversely affected. Additionally, in the case when the effective load capacitance is small, the output voltage of an I/O driver may rise and fall too fast; thereby producing electromagnetic interference. Further, in such a case where the output voltage of an I/O driver rises and falls too fast, this may produce unwanted reflections off the transmission line to which the output of the I/O driver is connected.

A low delay attribute for I/O drivers is also generally desirable as it may facilitate faster operations for circuits that employ many such I/O drivers. The delay of an I/O driver is generally a time difference between a time at which an input signal of the I/O driver reaches a logic state during a transition and a time at which a corresponding output signal of the I/O driver reaches the logic state during the transition. As discussed, a lower delay generally translates to faster operations along a chain that employs one or more low-delay I/O drivers. Additionally, as with the slew rate, it is desirable for the delay of an I/O driver to be substantially independent of the output load so as not to adversely affect downstream operations due to load variations.

Finally, it is generally desirable for an I/O driver to generate an output voltage having relatively low jitter. Signal jitter is generally caused by power supply noise, device flicker and/or thermal noise of devices being operated in a linear region. Similar to slew rate control and delay control, an I/O driver having poor output signal jitter control may adversely affect downstream operations.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure provides for an apparatus to generate an output signal based on an input signal. The apparatus comprises a first field effect transistor (FET) including a first drain, a first source, and a first gate; and a second FET including a second drain, a second source, and a second gate, wherein the first source, the first drain, the second drain, and the second source are coupled in series between a first voltage rail and a second voltage rail, wherein the output signal is generated at an output node between the first and second drains of the first and second FETs, respectively. Additionally, the apparatus comprises a first feedback capacitor coupled between the first drain and the first gate of the first FET; and a second feedback capacitor coupled between the second drain and the second gate of the second FET.

The apparatus further comprises a first current source coupled between the first gate of the first FET and the second voltage rail, wherein the first current source is configured to generate a first current in response to a high logic state of the input signal, the first current decreasing the first gate voltage to turn on the first FET in order to couple the first voltage rail to the output node; and a second current source coupled between the first voltage rail and the second gate of the second FET, wherein the second current source is configured to generate a second current in response to a low logic state of the input signal, the second current increasing the second gate voltage to turn on the second FET in order to couple the output node to the second voltage rail.

The apparatus also comprises a control circuit configured to control the first current source based on a first gate voltage at the first gate of the first FET; and control the second current source based on a second gate voltage at the second gate of the second FET.

Another aspect of the disclosure relates to a method of generating an output signal at an output node based on an input signal. The method comprises: in response to the input signal transitioning from a low logic state to a high logic state, performing the following: enabling a first current source to generate a first current to decrease a first gate voltage of a first FET coupled between a first voltage rail and the output node; controlling the first current source to reduce the first current in response to the first gate voltage decreasing to a first defined voltage; routing the reduced first current from the output node to the first gate by way of a first feedback capacitor; and turning off a second FET coupled between the output node and a second voltage rail.

The method further comprises: in response to the input signal transitioning from the high logic state to the low logic state, performing the following: enabling a second current source to generate a second current to increase a second gate voltage of the second FET; controlling the second current source to reduce the second current in response to the second gate voltage increasing to a second defined voltage; routing the reduced second current from the second gate to the output node by way of a second feedback capacitor; and turning off the first FET.

An apparatus for generating an output signal at an output node based on an input signal. The apparatus comprises means for enabling a first current source to generate a first current to decrease a first gate voltage of a first FET coupled between a first voltage rail and the output node in response to the input signal transitioning from a low logic state to a high logic state; means for controlling the first current source to reduce the first current in response to the first gate voltage decreasing to a first defined voltage; means for routing the reduced first current from the output node to the first gate by way of a first feedback capacitor; and means for turning off a second FET coupled between the output node and a second voltage rail in response to the input signal transitioning from the low logic state to the high logic state.

Additionally, the apparatus comprises means for enabling a second current source to generate a second current to increase a second gate voltage of the second FET in response to the input signal transitioning from the high logic state to the low logic state; means for controlling the second current source to reduce the second current in response to the second gate voltage increasing to a second defined voltage; means for routing the reduced second current from the second gate to the output node by way of a second feedback capacitor; and means for turning off the first FET in response to the input signal transitioning from the high logic state to the low logic state.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
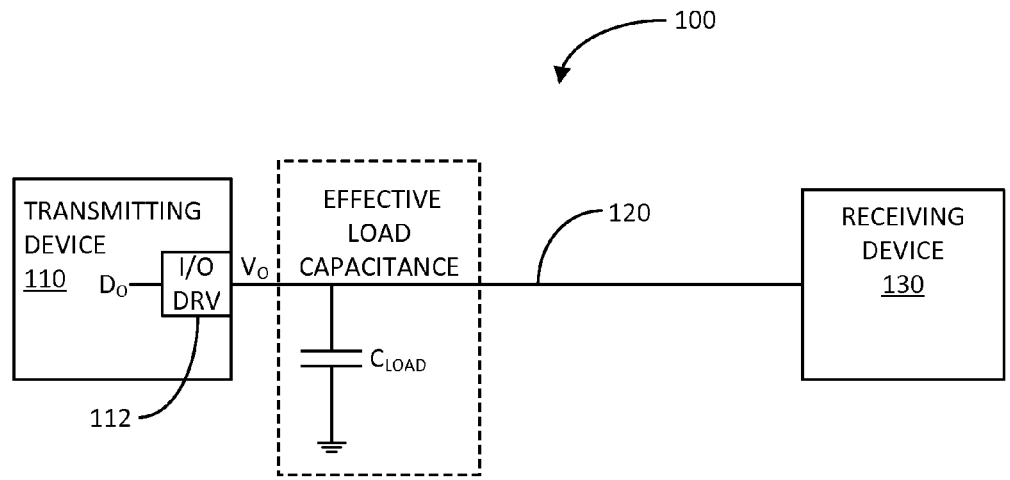
FIG. 1 illustrates a block diagram of an exemplary communication system in accordance with an aspect of the disclosure.

FIG. 1 illustrates a block diagram of an exemplary communication system 100 in accordance with an aspect of the disclosure. The communication system 100 comprises a transmitting device 110, a transmission line 120, and a receiving device 130. The transmitting device 110 is communicatively coupled to the receiving device 130 by way of the transmission line 120.

Although the transmitting device 110 is named for its signal transmission operation as exemplified herein, it shall be understood that the transmitting device may receive data from the receiving device 130 and/or one or more other devices. Similarly, although the receiving device 130 is named for its signal receiving operation as exemplified herein, it shall be understood that the receiving device may transmit data to the transmitting device and/or one or more other devices. The transmission line 120 may be an electrically-conductive trace disposed on a printed circuit board (PCB), transmission cable, or other types of signal transmission medium.

The transmitting device 110 may be configured as an integrated circuit (IC). As such, the IC 110 comprises an input/output driver (I/O) driver 112. The I/O driver 112 is configured to receive an input digital signal Do generated internally within the IC of the transmitting device 110, and generate an output signal or voltage Vo in response to the input digital signal Do. As an example, the input digital signal Do may be configured to have logic voltage levels suitable for processing within the IC of the transmitting device 110. Whereas, the I/O driver 112 configures the output voltage Vo to have logic voltage levels suitable for transmission to the receiving device 130 by way of the transmission line 120.

The transmission line 120, the receiving device 130, and other devices and/or transmission lines coupled to the transmission line 120 present an effective load at the output of the I/O driver 112. The effective load presents an associated effective load capacitance $C_{LOAD}$ at the output of the I/O driver 112. The effective capacitance $C_{LOAD}$ as seen by the output of the I/O driver 112 may vary depending on the operation of the receiving device 130 and one or more other devices that may be coupled to the transmission line 120.

As discussed in the Background section, the effective capacitance $C_{LOAD}$ may have adverse effects on the operation of the I/O driver 112. For instance, if the effective load capacitance $C_{LOAD}$ is varying, this may cause the slew rate of the output voltage Vo to vary with the effective capacitance $C_{LOAD}$. As discussed, this may adversely affect downstream operations, such as the operation of the receiving device. Additionally, the effective load capacitance $C_{LOAD}$ may also increase the input-to-output signal delay of the I/O driver 112, as well as cause the delay to vary in response to a varying effective load capacitance $C_{LOAD}$. The following describes exemplary I/O drivers that reduce the effects on the slew rate and delay due to a varying effective load capacitance $C_{LOAD}$.

Figure 2A:
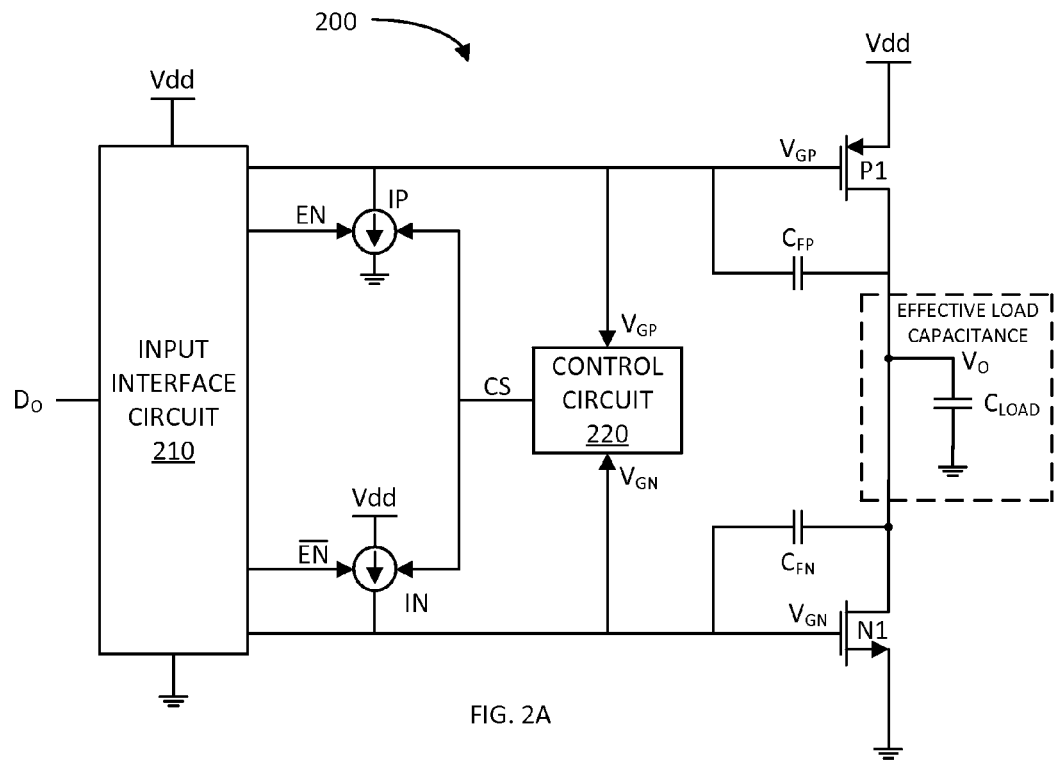
FIG. 2A illustrates a block/schematic diagram of an exemplary input/output (I/O) driver in accordance with another aspect of the disclosure.

FIG. 2A illustrates a block/schematic diagram of an exemplary input/output (I/O) driver 200 in accordance with another aspect of the disclosure. In summary, the I/O driver 200 includes circuitry for controlling the slew rate of the output voltage Vo of the I/O driver 200, and making the slew rate less susceptible to variation due to variation of the effective load capacitance $C_{LOAD}$ present at the output of the I/O driver 200. Additionally, the I/O driver 200 includes circuitry for controlling the input-to-output signal delay of the output voltage Vo of the I/O driver 200, and also making the delay less susceptible to variation due to variation in the effective load capacitance $C_{LOAD}$. Further, the I/O driver 200 may be configured for reduced power consumption.

In particular, the I/O driver 200 comprises a pull-up field effect transistor (FET) P1 and a pull-down FET N1 coupled between a first voltage rail (e.g., Vdd) and a second voltage rail (e.g., ground). The FET P1 may be configured as a p-channel metal oxide semiconductor FET (MOSFET), and the FET N1 may be configured as an n-channel MOSFET. As such, the source of FET P1 is coupled to the first voltage rail (e.g., Vdd), the drain of FET P1 is coupled to the drain of FET N1, and the source of FET N1 is coupled to the second voltage rail (e.g., ground).

The output of the I/O driver 200 is situated at a node between the respective drains of FETs P1 and N1. The output may be connected to one or more other devices by way of a transmission line, as exemplified in FIG. 1. If connected, such one or more other devices and transmission line presents an effective load capacitance $C_{LOAD}$ to the output of the I/O driver 200, as indicated by the represented load capacitor $C_{LOAD}$ enclosed within a dashed boxed.

For slew rate control, as discussed in more detail further herein, the I/O driver 200 comprises a first feedback capacitor $C_{FP}$ coupled between the drain and gate of FET P1, and a second feedback capacitor $C_{FN}$ coupled between the drain and gate of FET N1. Additionally, for slew rate and delay control, as discussed in more detail further herein, the I/O driver 200 comprises a control circuit 220 including inputs configured to receive a gate voltage $V_{GP}$ of FET P1 and a gate voltage $V_{GN}$ of FET N1. The control circuit 220 is also configured to generate a control signal CS based on gate voltage $V_{GP}$ or $V_{GN}$.

Further, for slew rate and delay control, the I/O driver 200 comprises a first current source IP coupled between the gate of FET P1 and the second voltage rail (e.g., ground), and a second current source IN coupled between the first voltage rail (e.g., Vdd) and the gate of FET N1. The currents generated by the current sources IP and IN are responsive to the control signal CS generated by the control circuit 220, as discussed in more detail further herein.

The I/O 200 comprises an input interface circuit 210 configured to receive an input signal Do and generate gate voltages $V_{GP}$ and $V_{GN}$ or high impedance states for the gates of FETs P1 and N1 based on the input signal Do, as discussed in more detail further herein. Additionally, the input interface circuit 210 is configured to generate an enable/disable signal EN for enabling and disabling the first and second current sources IP and IN, as discussed in more detail herein. The input interface circuit 210 is coupled between the first voltage rail (e.g., Vdd) and the second voltage rail (e.g., ground). The operation of the I/O driver 200 is discussed below in detail with reference to a timing diagram depicted in FIG. 2B.

Figure 2B:
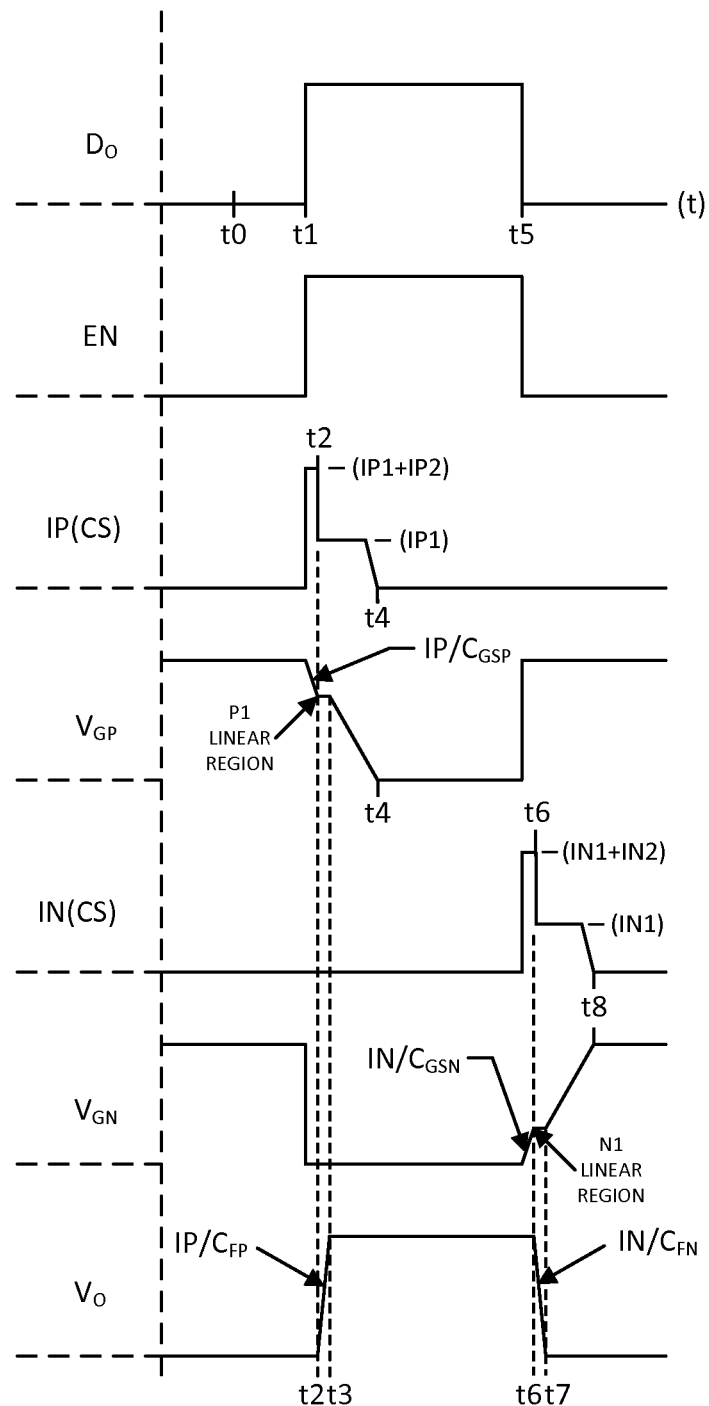
FIG. 2B illustrates a timing diagram associated with the exemplary I/O driver in accordance with another aspect of the disclosure.

FIG. 2B illustrates a timing diagram associated with the exemplary I/O driver 200 in accordance with another aspect of the disclosure. The signals depicted in the timing diagram from top to bottom include the input signal Do, the enable/disable signal EN, the current IP generated by the current source IP based on the control signal CS, the gate voltage $V_{GP}$ of the pull-up FET P1, the current IN generated by the current source IN based on the control signal CS, the gate voltage $V_{GN}$ of the pull-down FET N1, and the output voltage Vo. The vertical axis for each signal is amplitude and the horizontal axis for each signal is time (t).

According to the timing diagram, at time t0, the input signal Do is at a low logic state. Based on the low logic state of the input signal Do, the input interface circuit 210 is applying a high logic state (e.g., Vdd) to the gate of the pull-up FET P1 to keep P1 turned off. Accordingly, as shown, the gate voltage $V_{GP}$ of the pull-up FET P1 is at the high logic state at time t0. Similarly, based on the low logic state of the input signal Do, the input interface circuit 210 has, in response to a previous transition of the input signal from high-to-low, enabled the current source IN via the EN signal to charge the gate of the pull-down FET N1 to a high logic state (e.g., Vdd) to turn on the pull-down FET N1. Accordingly, as shown, the gate voltage $V_{GN}$ of the pull-down FET N1 is at the high logic state at time t0.

Because, at time t0, the pull-up FET P1 is turned off and the pull-down FET is turned on, the output voltage Vo is at a low logic state (e.g., ground), as indicated by the timing diagram. Also, at time t0, the input interface circuit 210 is generating a low logic state for the enable/disable signal EN based on the low logic state of the input signal D0. The low logic state of the enable/disable signal EN causes the current source IP to be disabled and the current source IN to be enabled. However, due to the control signal CS, the enabled current source IN is generating substantially no current. Thus, as the timing diagram illustrates, the current sources IP and IN are generating substantially no current at time t0. Further, at time t0, the input interface circuit 210 presents a high impedance directly to the gate of the pull-down FET N1.

The operation of the I/O driver 200 in response to the input signal Do transitioning from a low logic state to a high logic state is as follows: As indicated by the timing diagram, at time t1, the input signal Do transitions from a low logic state to a high logic state. In response to the transition, the input interface circuit 210 generates a low logic state for the gate of the pull-down FET N1 to turn it off before the pull-up FET P1 turns on. This is done to prevent a "shoot-thru" current, which may occur if the pull-down FET N1 is not turned off before the pull-up FET P1 is turned on. The "shoot-thru" current would cause an I/O driver to consume significant power. Accordingly, by preventing the "shoot-thru" current, the I/O driver 200 is configured for low power consumption. As indicated by the time diagram, the gate voltage $V_{GN}$ of the pull-down FET N1 transitions to the low logic state at time t1.

Also, in response to the input signal Do transitioning from the low logic state to the high logic state, the input interface circuit 210 generates a high logic state for the enable/disable signal EN, as indicated by the timing diagram. The high logic state of the signal EN enables the current source IP to generate a current IP to bring down the gate voltage $V_{GP}$ of the pull-up FET P1 to a low logic state in a defined manner according to the control signal CS generated by the control circuit 220.

More specifically, during an initial phase of bringing down the gate voltage $V_{GP}$, the control circuit 220 configures the control signal CS to cause the current source IP to generate a relatively high current IP. This is done to quickly configure the pull-up FET P1 to operate in the linear region in order to couple the first voltage rail (e.g., Vdd) to the output node. This reduces the delay in the output voltage Vo reaching a high logic state in response to the input signal Do transitioning from a low logic state to a high logic state. The control circuit 220 monitors the gate voltage $V_{GP}$ to reduce the current IP generated by the current source IP when the gate voltage $V_{GP}$ reaches a defined voltage that causes the pull-up FET P1 to substantially reach linear region. The defined voltage is approximately Vdd−Vthp, where Vthp is the threshold voltage of the pull-up FET P1.

As indicated by the timing diagram, the initial current generated by the current source IP at time t1 is represented as IP1+IP2. This is because, in a following more detailed embodiment, there are two separate current sources IP1 and IP2 that are turned on to generate the relatively high current. At time t2, when the pull-down FET P1 begins to operate in the linear region, the current generated by the current source IP is reduced to IP1. This is because, in the following more detailed embodiment, the current source IP2 is turned off. In the exemplary embodiment, the current IP2 is greater than the current IP1.

As indicated by the timing diagram, during the time interval t1 to t2, the gate voltage $V_{GP}$ of the pull-up FET P1 decreases at a rate given by (IP1+IP2)/$C_{GSP}$, where $C_{GSP}$ is the gate-to-source capacitance of the pull-up FET P1. Because CGSP is relatively small and IP1+IP2 is relatively large, the resulting high current brings down the gate voltage $V_{GP}$ at a high rate to quickly configure the pull-up FET P1 to operate in the linear region. Once the gate voltage $V_{GP}$ decreases to about Vdd−Vthp, the current IP is reduced to cause the gate voltage $V_{GP}$ to gradually decrease. This causes the output voltage Vo to rise with a controlled slew rate given substantially by IP1/$C_{FP}$ until it reaches the high logic state at time t3, as indicated by the timing diagram. The slew rate of the output voltage Vo is well controlled and substantially independent of the effective load capacitance $C_{LOAD}$ because of the current source IP producing a substantially constant current IP1 through the feedback capacitor $C_{FP}$.

As indicated by the timing diagram, during time interval t2 to t3, the gate voltage $V_{GP}$ is substantially constant or slightly decreasing. This is because the current is being supplied to the gate of the pull-up FET P1 from the first voltage rail (e.g., Vdd) by way of the pull-up FET P1, the output node, and the feedback capacitor $C_{FP}$. Once the output voltage Vo reaches the high logic state at time t3, the gate voltage $V_{GP}$ decreases until it reaches the low logic state at time t4. At such time t4, the current source IP does not generate current as the gate voltage $V_{GP}$ is at a low logic state (e.g., substantially at ground).

For completeness, at time t1, the high logic state of the enable/disable signal EN disables the current source IN in order to maintain the gate voltage $V_{GN}$ of the pull-down FET N1 at a low logic state. Thus, as indicated in the timing diagram, the current source IN generates substantially no current. Additionally, at time t1, the input interface circuit 210 presents a high impedance at the gate of the pull-up FET P1 so as not to affect the operation of the current source IP pulling down the gate voltage $V_{GP}$ of the pull-up FET P1.

The operation of the I/O driver 200 in response to the input signal Do transitioning from a high logic state to a low logic state is as follows: As indicated in the timing diagram, at time t5, the input signal Do transitions from the high logic state to the low logic state. In response to the transition, the input interface circuit 210 generates a high logic state for the gate of the pull-up FET P1 to turn it off before the pull-down FET N1 turns on. Again, this is done to prevent a "shoot-thru" current, which may occur if the pull-up FET P1 is not turned off before the pull-down FET N1 is turned on. As indicated in the timing diagram, the gate voltage $V_{GP}$ of the pull-up FET P1 transitions to the high logic state at time t5.

Also, in response to the input signal Do transitioning from the high logic state to the low logic state, the input interface circuit 210 generates a low logic state for the enable/disable signal EN, as indicated in the timing diagram. The low logic state of the signal EN enables the current source IN to generate a current IN to bring up the gate voltage $V_{GN}$ of the pull-down FET N1 to a high logic state in a defined manner according to the control signal CS generated by the control circuit 220.

More specifically, during an initial phase of bringing up the gate voltage $V_{GN}$, the control circuit 220 configures the control signal CS to cause the current source IN to generate a relatively high current IN. This is done to quickly configure the pull-down FET N1 to operate in the linear region in order to couple the output node to the second voltage rail (e.g., ground). This reduces the delay in the output voltage Vo reaching a low logic state in response to the input signal Do transitioning from a high logic state to a low logic state. The control circuit 220 monitors the gate voltage $V_{GN}$ to reduce the current IN generated by the current source IN when the gate voltage $V_{GN}$ reaches a defined voltage that causes the pull-down FET P1 to operate in the linear region. The defined voltage is approximately Vthn, where Vthn is the threshold voltage of the pull-down FET N1.

As indicated in the timing diagram, the initial current generated by the current source IN at time t5 is represented as IN1+IN2. This is because, in a more detailed embodiment discussed further herein, there are two separate current sources IN1 and IN2 that are turned on to generate the relatively high current. At time t6, when the pull-down FET N1 reaches linear region, the current generated by the current source IN is reduced to IN1. This is because, in the following more detailed embodiment, the current source IN2 is turned off. In the exemplary embodiment, the current IN2 is greater than the current IN1.

As indicated in the timing diagram, during the time interval t5 to t6, the gate voltage $V_{GN}$ of the pull-down FET N1 increases at a rate given by (IN1+IN2)/$C_{GSN}$, where $C_{GSN}$ is the gate-to-source capacitance of the pull-down FET N1. Since $C_{GSN}$ is relatively small and IN1+IN2 is relatively large, the resulting high current brings up the gate voltage $V_{GN}$ at a high rate to quickly configure the pull-down FET N1 to operate in linear region. Once the gate voltage $V_{GN}$ increases to about Vthn, the current IN is reduced to cause the gate voltage $V_{GN}$ to gradually increase. This causes the output voltage Vo to decrease with a controlled slew rate given substantially by IN1/$C_{FN}$ until it reaches the low logic state at time t7, as indicated in the timing diagram. The slew rate of the output voltage Vo is well controlled and substantially independent of the effective load capacitance $C_{LOAD}$ because of the current source IN producing a substantially constant current IN through the feedback capacitor $C_{FN}$.

As indicated in the timing diagram, during time interval t6 to t7, the gate voltage $V_{GN}$ is substantially constant or slightly increasing. This is because the current is being transferred from the gate of the pull-down FET N1 to the second voltage rail (e.g., ground) by way of the feedback capacitor $C_{FN}$, the output node, and the pull-down FET N1.

Once the output voltage Vo reaches the low logic state at time t7, the gate voltage $V_{GN}$ increases until it reaches the high logic state at time t8. At such time t8, the current source IN does not generate current as the gate voltage $V_{GN}$ is at the same potential as the first voltage rail (e.g., Vdd) applied to the current source IN.

For completeness, at time t5, the low logic state of the enable/disable signal EN disables the current source IP in order to maintain the gate voltage $V_{GP}$ of the pull-up FET P1 at a high logic state. Thus, as indicated in the timing diagram, the current source IP generates substantially no current. Additionally, at time t5, the input interface circuit 210 presents a high impedance at the gate of the pull-down FET N1 so as not to affect the operation of the current source IN pulling up the gate voltage $V_{GN}$ of the pull-down FET N1.

As discussed above in detail, the I/O driver 200 is configured for relatively low power consumption, low delay, and controlled slew rate. To summarize, the input interface circuit 210 prevents the simultaneous turning on of both the pull-up FET P1 and the pull-down FET N1 during transitions to prevent "shoot thru" current; and thus, keep the power consumption of the I/O driver 200 relatively low.

The current sources IP and IN provide relatively large currents to change the corresponding gate voltages $V_{GP}$ and $V_{GN}$ in response to input signal transitions to expedite configuring the pull-up and pull-down FETs P1 and N1 to operate in the linear region, and allow the output voltage Vo to start its transition earlier. This reduces the time delay between the transition of the input signal Do and the transition of the output signal Vo.

The current sources IP and IN are also configured to generate a relatively small current to provide a controlled slew rate of the output signal Vo substantially independent of the effective load capacitance $C_{LOAD}$. The controlled slew rate may be gradual so as to reduce electromagnetic interference (EMI) and reflections off of a transmission line that may be coupled to the output node of the I/O driver 200.

Additionally, the I/O driver 200 reduces jitter that may be present in the output node due to the well-controlled delay and slew rate resulting from the substantially constant currents generated by the current sources IP and IN. The current sources IP and IN may be configured to be substantially independent of supply variation and the zero crossing points are very insensitive to supply noise as well. Additionally, the device noise contributions to jitter in the I/O driver 200 can be further reduced by proper sizing of the current sources (e.g., very large gate area (W×L) with small W/L ratio). Additionally, configuring the $C_{FN}$, $I_{N1}$, $I_{N2}$, and $C_{FP}$, IP1, and IP2 proportionally larger improves the jitter, but may slightly degrade the power efficiency.

Figure 3:
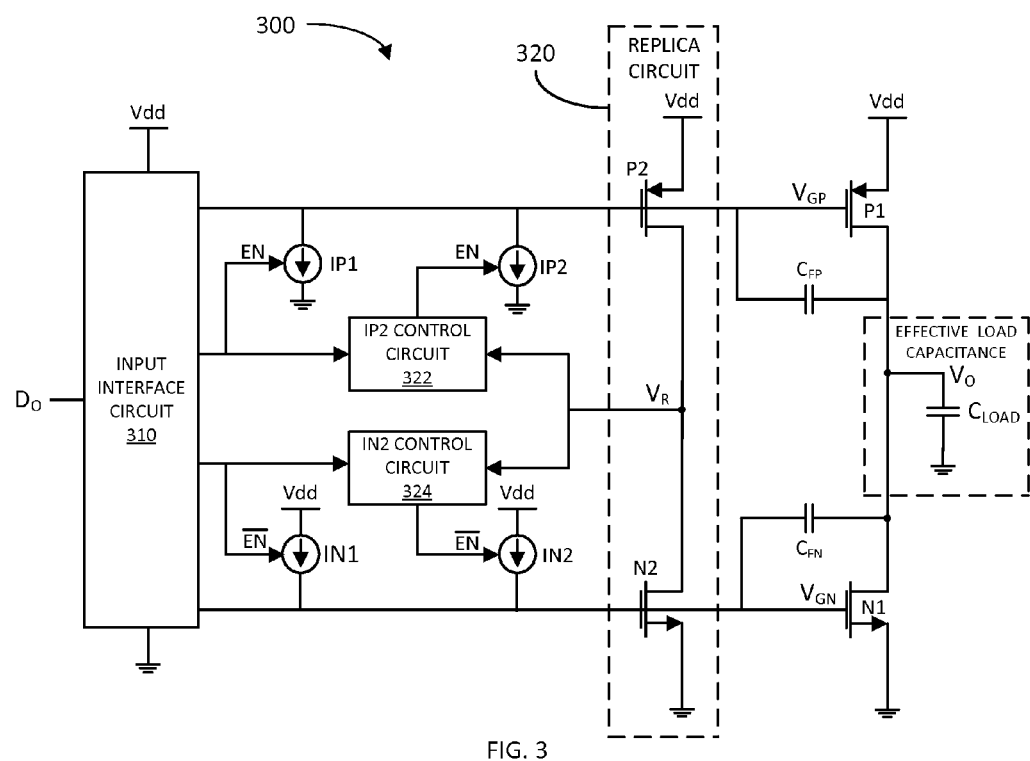
FIG. 3 illustrates a block/schematic diagram of another exemplary input/output (I/O) driver in accordance with another aspect of the disclosure.

FIG. 3 illustrates a block/schematic diagram of another exemplary input/output (I/O) driver 300 in accordance with another aspect of the disclosure. The I/O driver 300 may be a more detailed exemplary implementation of the I/O driver 200 previously discussed.

In summary, the I/O driver 300 includes two current sources coupled to each gate. Both current sources are turned on to expedite configuring the corresponding output FET P1 or N1 to operate in the linear region. Only one of the current sources is turned on to cause the output voltage Vo to transition with a controlled slew rate after the corresponding FET has reached linear region. Additionally, the I/O driver 300 includes a control circuit for disabling one of the current sources when the corresponding gate voltage reaches a defined voltage; for example, at a voltage substantially at the start of linear region for corresponding output FET P1 or N1.

In particular, the I/O driver 300 comprises an output pull-up FET P1 and an output pull-down FET N1 coupled between the first voltage rail (e.g., Vdd) and the second voltage rail (e.g., ground). The output node of the I/O driver 300 is situated between the respective drains of the pull-up FET P1 and pull-down FET N1. The output node may be coupled to a load, which may include one or more transmission lines and one or more devices coupled to the one or more transmission lines. Such load applies an effective load capacitance $C_{LOAD}$ at the output node of the I/O driver 300. The I/O driver 300 includes feedback capacitors $C_{FP}$ and $C_{FN}$ coupled between the output node and the respective gates of the pull-up FET P1 and pull-down FET N1.

As previously discussed, the I/O driver 300 provides a more detailed implementation of the control circuit 220 of the I/O driver 200. In this regard, the I/O driver 300 comprises an output replica circuit 320 including a replica pull-up FET P2 and a replica pull-down FET N2 coupled between the first voltage rail (e.g., Vdd) and the second voltage rail (e.g., ground). More specifically, the replica pull-up FET P2 includes a source coupled to the first voltage rail (e.g., Vdd), a drain coupled to the drain of the replica pull-down FET N2, and a gate coupled to the gate of the output pull-up FET P1. The replica pull-down FET N2 includes a source coupled to the second voltage rail (e.g., ground), and a gate coupled to the gate of the output pull-down FET N1. As discussed in more detail below, the output replica circuit 320 generates a control voltage Vr at the node between the drains of the replica pull-up and pull-down FETs P2 and N2.

The I/O driver 300 further comprises a current source IP1 and a current source IP2, both coupled between the gates of the pull-up FETs P1 and P2 and the second voltage rail (e.g., ground). Similarly, the I/O driver 300 comprises a current source IN1 and a current source IN2, both coupled between the first voltage rail (e.g., Vdd) and the gates of the pull-down FETs N1 and N2. The I/O driver 300 also comprises an input interface circuit 310 including an input to receive an input signal Do, and respective outputs coupled to the gates of the pull-up FETs P1 and P2, to an enable EN input of the current source IP1 and an input of an IP2 control circuit 322, to an input of an IN2 control circuit 324 and a complementary enable input $\overline{EN}$ input of the current source IN1, and to the gates of the pull-down FETs N1 and N2. The input interface circuit 310 is coupled between the first voltage rail (e.g., Vdd) and the second voltage rail (e.g., ground) to generate the appropriate levels at its outputs.

As mentioned, the I/O driver 300 comprises the IP control circuit 322 including an input to receive the control voltage Vr from the output replica circuit 320, an enable/disable signal EN from the input interface circuit 310, and an output coupled to an enable input of the current source IP2. Similarly, the I/O driver 300 comprises the IN2 control circuit 324 including an input to receive the control voltage Vr from the replica circuit 320, the enable/disable signal $\overline{EN}$ from the input interface circuit 310, and an output coupled to a complementary enable input $\overline{EN}$ of the current source IN2.

The IP2 control circuit 322 is configured to enable the current source IP2 in response to the enable/disable signal EN being in a high logic state, and the control voltage Vr being in a low logic state. The IP2 control circuit 322 is configured to disable the current source IP2 in response to the control voltage Vr subsequently transitioning to the high logic state (e.g., when the gate voltage $V_{GP}$ decreases to a defined voltage (e.g., $V_{DD}$–Vthp2, where Vthp2 is the threshold voltage of the replica pull-up FET P2)).

Similarly, the IN2 control circuit 324 is configured to enable the current source IN2 in response to the enable/disable signal EN being in a low logic state, and the control voltage Vr being in a high logic state. The IN2 control circuit 324 is configured to disable the current source IN2 in response to the control voltage Vr subsequently transitioning to the low logic state (e.g., when the gate voltage $V_{GN}$ decreases to a defined voltage (e.g., Vthn2, where Vthn2 is the threshold voltage of the replica pull-down FET N2)).

The replica pull-up and pull-down FETs P2 and N2 may be sized smaller (e.g., by a size ratio of 20 to 30) than the output pull-up and pull-down FETs P1 and N1. For example, the replica FETs P2 and N2 may have a size (gate width and/or gate length) that is proportionally smaller than the output FETs P1 and N1. Additionally, in contrast to the output FETs P1 and N1, the I/O driver 300 may not have a capacitive load or a relatively small parasitic capacitive load at the Vr node, as compared to the effective load capacitance $C_{LOAD}$ that may be present at the output node of the I/O driver.

The combination of the smaller replica FETs P2 and N2 and less capacitance load on the control node Vr causes the control voltage Vr to slightly lead the output voltage Vo when transitioning from a low logic state to a high logic state, or vice-versa. As a consequence, when the input signal transitions to a high logic state, the current source IP2 is disabled when the replica pull-up FET P2 reaches linear region, which may occur slightly before the output pull-up FET P1 reaches the linear region. Similarly, when the input signal transitions to a low logic state, the current source IN2 is disabled when the replica pull-down FET N2 reaches linear region, which may occur slightly before the output pull-down FET N1 reaches the linear region. This may be done for power saving purposes to minimize the time the current sources IP2 and IN2 are on, while expediting the time the output FETs P1 and N1 are brought to the linear region.

The operation of the I/O driver 300 is similar to that of I/O driver 200 previously discussed, and the timing diagram depicted in FIG. 2B also applies. That is, immediately prior to the input signal Do transitioning from a low logic state to a high logic state, the output and replica pull-up FETs P1 and P2 are turned off (e.g., gate voltage $V_{GP}$ is substantially at Vdd), the output and replica pull-down FETs N1 and N2 are turned on (e.g., gate voltage $V_{GN}$ is substantially at Vdd), and the output and replica voltages Vo and Vr are substantially at a low logic state (e.g., ground). Additionally, all of the current sources IP1, IP2, IN1, and IN2 are turned off.

In response to the input signal Do transitioning from a low logic state to a high logic state, the input interface circuit 310 presents a high impedance to the gates of the pull-up FETs P1 and P2, generates a high logic state (e.g., Vdd) for the enable/disable signal EN, and applies a low logic state to the gates of the output and replica pull-down FETs N1 and N2. The high logic state of the enable/disable signal EN enables the current source IP1 to generate current IP1, and maintains current source IN1 disabled. Additionally, the IN2 control circuit 324 is unresponsive to the high logic state of the enable/disable signal EN, and maintains the current source IN2 disabled.

Further, in response to the enable/disable signal EN being in a high logic state and the control voltage Vr being in a low logic state, the IP2 control circuit 322 enables the current sources IP2 to generate current IP2. The low logic state at the gates of output and replica pull-down FETs N1 and N2 turn off these devices so as to prevent "shoot-thru" currents to flow through P1 and N1 and P2 and N2, respectively. The high impedance presented to the gates of the output and replica pull-up FETs P1 and P2 prevents the input interface circuit 310 from interfering with the decrease in the gate voltage $V_{GP}$ due to the currents IP1 and IP2.

As both current sources IP1 and IP2 are generating current, the gate voltage $V_{GP}$ of the output and replica pull-up FETs P1 and P2 is decreasing at a relatively high rate; that is, a rate substantially given by $(IP1+IP2)/C_{GSP}$. When the gate voltage $V_{GP}$ decreases to the threshold voltage of the replica pull-up FET P2 (e.g., Vdd–Vthp2), the replica pull-up FET P2 conducts and causes the control voltage Vr to rise from the low logic state to the high logic state. In response to the control voltage Vr being substantially at the high logic state, the IP2 control circuit 322 disables the current source IP2. Since, as previously discussed, the replica pull-up FET P2 is smaller than the output pull-up FET P1 and the capacitance loading on the control node Vr may be substantially less than the effective load capacitance $C_{LOAD}$ at the output node of the I/O driver 300, the replica pull-up FET P2 reaches linear region slightly before the output pull-up FET P1 reaches the linear region.

The current source IP1 continues to generate current after the current source IP2 ceases generating current. The current source IP1 continues to reduce the gate voltage $V_{GP}$ to fully bring the output pull-up FET P1 into linear region, thereby causing the device P1 to conduct and bring up the output voltage Vo to a high logic state (e.g., Vdd) at a controlled slew rate given by $IP1/C_{FP}$. When the gate voltage $V_{GP}$ decreases to approximately to the low logic state (e.g., ground), the current source IP1 ceases generating current as there is no source voltage being applied to the current source.

Thus, in summary, both current sources IP1 and IP2 are turned on in response to the input signal Do transitioning to a high logic level to quickly decrease the gate voltage $V_{GP}$ of the output pull-up FET P1 to expedite configuring FET P1 to operate in the linear region. This reduces the delay between the transition of the input signal Do and the transition of the output signal Vo. At approximately the time the output pull-up FET P1, or more accurately, the replica pull-up FET P2 reaches linear region, the current source IP2 is turned off and the current source IP1 remains on to bring up the output voltage Vo with a controlled slew rate.

The I/O driver 300 operates in a similar manner as discussed above in response to the input signal transitioning from a high logic state to a low logic state. That is, in response to the input signal Do transitioning from a high logic state to a low logic state, the input interface circuit 310 presents a high impedance to the gates of the pull-down FETs N1 and N2, generates a low logic state (e.g., ground) for the enable/disable signal EN, and applies a high logic state to the gates of the output and replica pull-up FETs P1 and P2. The low logic state of the enable/disable signal EN enables the current source IN1 to generate current IN1, and maintains current source IP1 disabled. Additionally, the IP2 control circuit 322 is unresponsive to the low logic state of the enable/disable signal EN, and maintains the current source IP2 disabled.

Further, in response to the enable/disable signal EN being at a low logic state and the control voltage Vr being at a high logic state, the IN2 control circuit 324 enables the current sources IN2 to generate current IN2. The high logic state at the gates of output and replica pull-down FETs N1 and N2 turn off these devices so as to prevent "shoot-thru" currents to flow through P1 and N1 and P2 and N2, respectively. The high impedance presented to the gates of the output and replica pull-down FETs N1 and N2 prevents the input interface circuit 310 from interfering with the increase in the gate voltage $V_{GN}$ due to the currents IN1 and IN2.

As both current sources IN1 and IN2 are generating current, the gate voltage $V_{GN}$ of the output and replica pull-down FETs N1 and N2 is increasing at a relatively high rate; that is, a rate substantially given by $(IN1+IN2)/C_{GSN}$. When the gate voltage $V_{GN}$ increases to the threshold voltage of the replica pull-down FET N2 (e.g., Vthn2), the replica pull-down FET N2 conducts and causes the control voltage Vr to decrease from the high logic state to the low logic state. In response to the control voltage Vr decreasing substantially to the low logic state, the IN2 control circuit 324 disables the current source IN2. Since, as previously discussed, the replica pull-down FET N2 is smaller than the output pull-down FET N1 and the capacitance loading on the control node Vr may be substantially less than the effective load capacitance $C_{LOAD}$ at the output node of the I/O driver 300, the replica pull-down FET N2 reaches linear region slightly before the output pull-down FET N1 reaches the linear region.

The current source IN1 continues to generate current after the current source IN2 ceases generating current. The current source IN1 continues to increase the gate voltage $V_{GN}$ to fully bring the output pull-down FET N1 into linear region; thereby causing the device N1 to conduct and bring down the output voltage Vo to the low logic state (e.g., ground) at a controlled slew rate given substantially by $IN1/C_{FN}$. When the gate voltage $V_{GN}$ increases to approximately to the high logic state (e.g., Vdd), the current source IN1 ceases generating current as both sides of the current source IN1 are at substantially the same voltage (Vdd).

Thus, in summary, both current sources IN1 and IN2 are turned on in response to the input signal Do transitioning to a low logic state to quickly increase the gate voltage $V_{GN}$ of the output pull-down FET N1 and expedite the configuring of the output pull-down FET N1 to operate in the linear region. This reduces the delay between the transition of the input signal Do and the transition of the output signal Vo. At approximately the time the output pull-down FET N1, or more accurately, the replica pull-down FET N2 reaches linear region, the current source IN2 is turned off and the current source IN1 remains on to bring down the output voltage Vo to a low logic state at a controlled slew rate.

Figure 4:
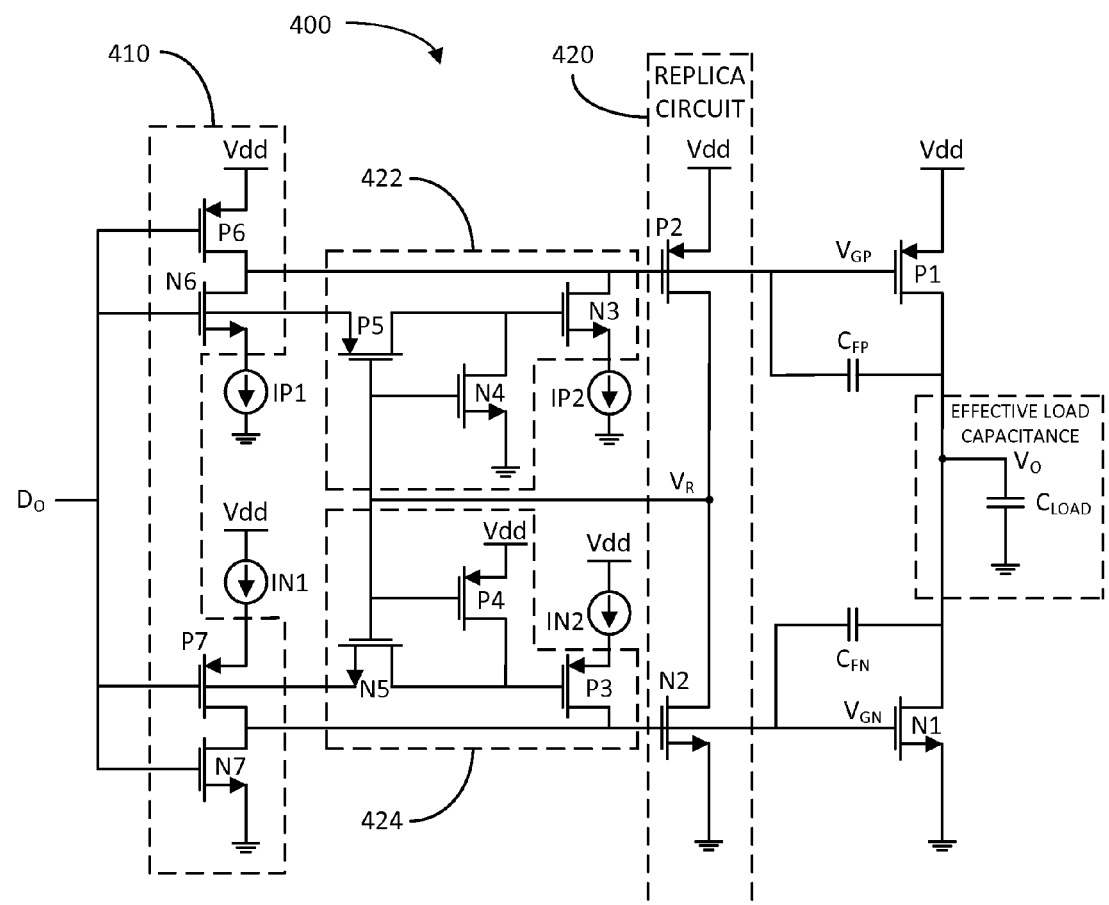
FIG. 4 illustrates a schematic diagram of another exemplary input/output (I/O) driver in accordance with another aspect of the disclosure.

FIG. 4 illustrates a schematic diagram of another exemplary input/output (I/O) driver 400 in accordance with another aspect of the disclosure. The I/O driver 400 is similar to that of I/O driver 300 previously discussed, except that I/O driver 400 includes exemplary detailed implementations of the input interface circuit 310, the IP2 control circuit 322, and the IN2 control circuit 324. The remaining elements of I/O driver 400 are essentially the same as that of I/O driver 300 previously discussed.

In particular, the I/O driver 400 comprises an output pull-up FET P1 and an output pull-down FET N1 coupled between the first voltage rail (e.g., Vdd) and the second voltage rail (e.g., ground). That is, the sources of the pull-up FET P1 and pull-down FET N1 are coupled to the first and second voltage rails (e.g., Vdd and ground), respectively. The output node of the I/O driver 400 is situated between the respective drains of the pull-up FET P1 and pull-down FET N1. The output node may be coupled to a load, which may include one or more transmission lines and one or more devices coupled to the one or more transmission lines. Such load presents an effective load capacitance $C_{LOAD}$ at the output node of the I/O driver 400. The I/O driver 400 includes feedback capacitors $C_{FP}$ and $C_{FN}$ coupled between the output node and the respective gates of the pull-up FET P1 and pull-down FET N1.

Further, the I/O driver 400 comprises an output replica circuit 420 including a replica pull-up FET P2 and a replica pull-down FET N2 coupled between the first and second voltage rails (e.g., Vdd and ground). That is, the sources of the replica pull-up FET P2 and the replica pull-down FET N2 are coupled to the first and second voltage rails (e.g., Vdd and ground), respectively. The replica circuit 420 is configured to generate a control voltage Vr at a node between the drains of the replica FETs P2 and N2. The gate of the replica pull-up FET P2 is coupled to the gate of the output pull-up FET P1. Similarly, the gate of the replica pull-down FET N2 is coupled to the gate of the output pull-up FET N1. Similar to the I/O driver 300, the I/O driver 400 comprises current sources IP1 and IP2 coupled between the gates of the pull-up FETs P1 and P2 and the second voltage rail (e.g., ground). The I/O driver 400 comprises current sources IN1 and IN2 coupled between the first voltage rail (e.g., Vdd) and the gates of the pull-down FETs N1 and N2.

The I/O driver 400 comprises an input interface circuit 410 including a FET P6 and a FET N6 coupled between the first voltage rail (e.g., Vdd) and the current source IP1. More specifically, the source of FET P6 is coupled to the first voltage rail (e.g., Vdd), the drain of FET P6 is coupled to the drain of FET N6, and the source of FET N6 is coupled to the current source IP1. The drains of FETs P6 and N6 are coupled to the gates of the pull-up FETs P1 and P2. The gates of FETs P6 and N6 are configured to receive the input signal Do.

Additionally, the input interface circuit 410 comprises a FET P7 and a FET N7 coupled between the current source IN1 and the second voltage rail (e.g., ground). More specifically, the source of FET P7 is coupled to the current source IN1, the drain of FET P7 is coupled to the drain of FET N7, and the source of FET N7 is coupled to the second voltage rail (e.g., ground). The drains of FETs P7 and N7 are coupled to the gates of the pull-down FETs N1 and N2. The gates of FETs P7 and N7 are configured to receive the input signal Do.

The I/O driver 400 comprises an IP2 control circuit 422 including FETs P5, N3, and N4. The FET P5 includes a source a configured to receive the input signal Do, a gate configured to receive the control voltage Vr, and a drain coupled to the gate of FET N3 and the drain of FET N4. The FET N3 includes a drain coupled to the gates of the pull-up FETs P1 and P2, and a source coupled to the current source IP2. The FET N4 includes a gate configured to receive the control voltage Vr, and a drain coupled to the second voltage rail (e.g., ground).

The I/O driver 400 comprises an IN2 control circuit 424 including FETs N5, P3, and P4. The FET N5 includes a source configured to receive the input signal Do, a gate configured to receive the control voltage Vr, and a drain coupled to the gate of FET P3 and the drain of FET P4. The FET P3 includes a source coupled to the current source IN2 and a drain coupled to the gates of the pull-down FETs N1 and N2. The FET P4 includes a gate configured to receive the control voltage Vr, and a source coupled to the first voltage rail (e.g., Vdd).

Since the discussion of the overall operation of I/O driver 400 has essentially been provided with reference to I/O driver 300, the following discussion is focused on the operation of the input interface circuit 410, the IP2 control circuit 422, and the IN2 control circuit 424.

As previously discussed with reference to input interface circuit 310, the input interface circuit 410, in response to the input signal Do transitioning to a high logic state, is configured to present a high impedance to the gates of the pull-up FETs P1 and P2, enable the current sources IP1 and IP2, maintain the current sources IN1 and IN2 disabled, and apply a low logic state to the gates of the pull-down FETs N1 and N2. More specifically, the high logic state of the input signal Do turns off FET P6 to present a high impedance at the gates of the pull-up FETs P1 and P2 from the perspective of FET P6. The high logic state of the input signal Do turns on FET N6 to couple the current source IP1 to the gates of the pull-up FETs P1 and P2 for decreasing the gate voltage $V_{GP}$ of the pull-up FETs P1 and P2 to turn on these devices in a defined manner as previously discussed.

The high logic state of the input signal Do turns off FET P7 to maintain the current source IN1 disabled, and turns on FET N7 to cause the gate voltage $V_{GN}$ of the pull-down FETs N1 to N2 to quickly decrease to a low logic state (e.g., ground) to turn off these devices. As such, the input interface circuit 410 is configured to turn off the output pull-down FET N1 prior to turning on the pull-up FET P1 to prevent "shoot-thru" current through these devices. This is because the FET N7 quickly turns to reduce $V_{GN}$ to turn off the output pull-down FET N1, whereas the $V_{GP}$ decreases as a function of the current sources IP1 and IP2 resulting in the pull-up FET P1 turning on after the pull-down FET N1 is off.

In response to the input signal Do transitioning to a low logic state, the input interface circuit 410 is configured to present a high impedance to the gates of the pull-down FETs N1 and N2, enable the current sources IN1 and IN2, maintain the current sources IP1 and IP2 disabled, and apply a high logic state to the gates of the pull-up FETs P1 and P2. More specifically, the low logic state at the input signal Do turns off FET N7 to present a high impedance at the gates of the pull-down FETs N1 and N2 from the perspective of FET N7. The low logic state at the input signal Do turns on FET P7 to couple the current source IN1 to the gates of the pull-down FETs N1 and N2 for increasing the gate voltage $V_{GN}$ of the pull-down FETs N1 and N2 to turn on these devices in a defined manner as previously discussed.

The low logic state of the input signal Do turns off FET N6 to maintain the current source IP1 disabled, and turns on FET P6 to cause the gate voltage $V_{GP}$ of the pull-up FETs P1 to P2 to quickly increase to a high logic state (e.g., Vdd) to turn off these devices. As such, the input interface circuit 410 is configured to turn off the output pull-up FET P1 prior to turning on the pull-down FET N1 to prevent "shoot-thru" current through these devices. This is because the FET P6 quickly turns on to increase $V_{GP}$ and turn off the output pull-up FET P1, whereas the $V_{GN}$ increases as a function of the current sources IP1 and IP2 resulting in the pull-down FET N1 turning on after the pull-up FET P1 is off.

As previously discussed, the IP2 control circuit 422 is configured to enable the current source IP2 in response to the input signal Do transitioning to a high logic state, and disable the current source IP2 in response to the gate voltage $V_{GP}$ decreasing to a defined voltage that configures the replica pull-up FET P2 to operate in the linear region. More specifically, when the input signal Do transitions to the high logic state, the control voltage Vr of the output replica circuit 420 is in a low logic state since the output voltage Vo was also at the low logic state. The high logic state of the input signal Do is applied to the source of FET P5 causing the device to turn on as its gate voltage is at Vr (e.g., a low logic state). The turning on of FET P5 causes the high logic state to be applied to the gate of FET N3; thereby, turning on FET N3 and coupling the current source IP2 to the gate of pull-up FETs P1 and P2 (i.e, enabling current source IP2).

The reduction in the gate voltage $V_{GP}$ due to current sources IP1 and IP2 expedites the configuring of the replica pull-up FET P2 to operate in the linear region. When this occurs, the control voltage Vr transitions from a low logic state to a high logic state. The control voltage Vr being at the high logic state causes the FET P5 to turn off and the FET N4 to turn on. The turning on of FET N4 decreases the gate voltage of FET N3 to a low logic state; thereby, turning off FET N3 and disabling the current source IP2.

The operation of the IN2 current control circuit 424 is similar to that of IP2 control circuit 422. In particular, the IN2 control circuit 424 is configured to enable the current source IN2 in response to the input signal Do transitioning to a low logic state, and disable the current source IN2 in response to the gate voltage $V_{GN}$ increasing to a defined voltage that configures the replica pull-down FET N2 to operate in the linear region. More specifically, when the input signal Do transitions to the low logic state, the control voltage Vr of the output replica circuit 420 is in a high logic state since the output voltage Vo is also at the high logic state. The low logic state of the input signal Do is applied to the source of FET N5 causing the device to turn on as its gate voltage is at Vr (e.g., a high logic state). The turning on of FET N5 causes the low logic state to be applied to the gate of FET P3; thereby, turning on FET P3 and coupling the current source IN2 to the gate of pull-down FETs N1 and N2 (i.e, enabling current source IN2).

The increase in the gate voltage $V_{GN}$ due to current sources IN1 and IN2 causes the operation of the replica pull-down FET N2 to quickly reach the linear region. When this occurs, the control voltage Vr transitions from a high logic state to a low logic state. The control voltage Vr being at the low logic state causes the FET N5 to turn off and the FET P4 to turn on. The turning on of FET P4 increases the gate voltage of FET P3 to a high logic state; thereby, turning off FET P3 and disabling the current source IN2.

Figure 5:
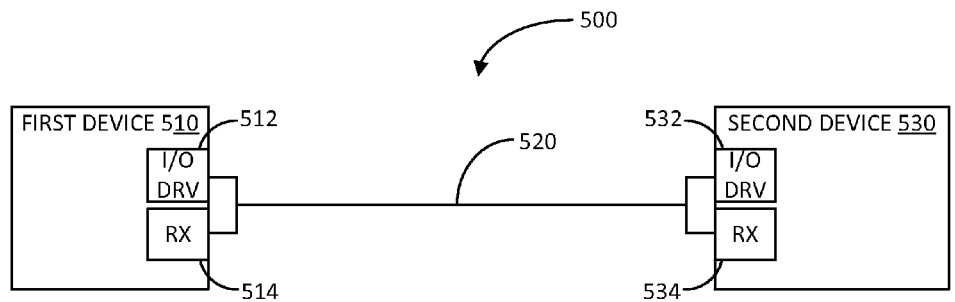
FIG. 5 illustrates a block diagram of another exemplary communication system in accordance with another aspect of the disclosure.

FIG. 5 illustrates a block diagram of an exemplary communication system 500 in accordance with another aspect of the disclosure. Often, it is desirable to configure an I/O driver to present a high impedance at the transmission line to which its output node is connected. This is because other devices may use the transmission line to send data to one or more other devices including the device comprising the I/O driver. This is exemplified with reference to the exemplary communication system 500.

In particular, the communication system 500 comprises a first device 510, a transmission line 520, and a second device 530. The transmission line 520 provides a communication medium for transmission of data between the first and second devices 510 and 530 in a bidirectional manner. In this regard, the first device 510 comprises an I/O driver 512 and a receiver 514, both coupled to the transmission line 520. Similarly, the second device 530 comprises an I/O driver 532 and a receiver 534.

When the first device 510 is transmitting a data signal to the second device 530 by way of the transmission line 520, the I/O driver 512 is enabled for performing the data transmission, and the receiver 514 may be disabled so as to prevent the receiver 514 from interfering with the transmission of the data signal. The disabling of the receiver 514 may include configuring an input of the receiver to present a high impedance to the transmission line 520. Further, in this regard, the receiver 534 of the second device 530 is enabled for receiving the data signal from the first device 510, and the I/O driver 532 is disabled so as to prevent the I/O driver from interfering with the transmission of the data signal from the I/O driver 512 to the receiver 534. The disabling of the I/O driver 532 may include configuring the output of the I/O driver 532 to present a high impedance to the transmission line 520.

Similarly, when the second device 530 is transmitting a data signal to the first device 510 by way of the transmission line 520, the I/O driver 532 is enabled for performing the data transmission, and the receiver 534 may be disabled so as to prevent the receiver 534 from interfering with the transmission of the data signal. The disabling of the receiver 534 may include configuring an input of the receiver 534 to present a high impedance to the transmission line. Further, in this regards, the receiver 514 of the first device 510 is enabled for receiving the data signal from the second device 530, and the I/O driver 512 is disabled so as to prevent the I/O driver 512 from interfering with the transmission of the data signal from the I/O driver 532 to the receiver 514. The disabling of the I/O driver 512 may include configuring the output of the I/O driver 512 to present a high impedance to the transmission line 520.

As the aforementioned example illustrates, there may be a need to disable an I/O driver in a manner that it presents a substantially high impedance at an output node to which a transmission line is connected. This allows the transmission line to be used by other devices without the I/O driver interfering with its use. Although, in the exemplary communication system 500, the transmission line 520 is shared by the first and second devices 510 and 530, it shall be understood that one or more other devices may share the transmission line 520 for transmission of data signals. Additionally, in the exemplary communication system 500, the transmission line 520 is described as providing bidirectional data communications between the first and second devices 510 and 530, it shall be understood that the transmission line 520 may provide unidirectional data transmission from one of the first and second devices 510 and 530 to the other one of the first and second devices.

Figure 6:
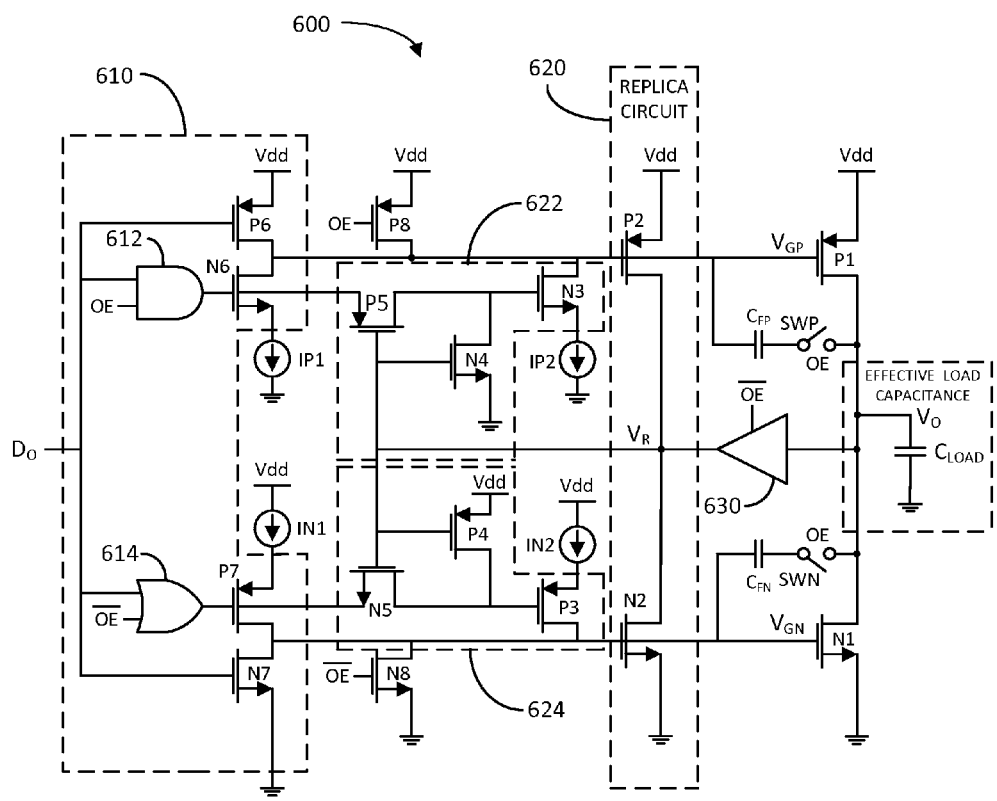
FIG. 6 illustrates a schematic diagram of another exemplary input/output (I/O) driver in accordance with another aspect of the disclosure.

FIG. 6 illustrates a schematic diagram of another exemplary input/output (I/O) driver 600 in accordance with another aspect of the disclosure. In summary, the I/O driver 600 is similar to that of I/O driver 400 previously discussed, except that I/O driver 600 includes additional circuitry for disabling the I/O driver and configuring the output node of the I/O driver to effectively present a substantially high impedance. As the components and operation of I/O driver 600 are similar to that of I/O driver 400 previously discussed in detail, the following discussion focuses on the circuitry for enabling and disabling the I/O driver and configuring the output node for presenting a substantially high impedance.

In particular, similar to the I/O driver 400, the I/O driver 600 comprises output pull-up FET P1, output pull-down FET N1, feedback capacitors $C_{FP}$ and $C_{FN}$, output replica circuit 620 including replica pull-up FET P2 and replica pull-down FET N1, IP2 control circuit 622, IN2 control circuit 624, and an input interface circuit 610.

For disabling purposes, the input interface circuit 610 further comprises an AND gate 612 including a first input configured to receive the input signal Do, a second input configured to receive an enable signal OE, and an output coupled to the gate of FET N6. The input interface circuit 610 further comprises an OR gate 614 including a first input configured to receive the input signal Do, a second input configured to receive a complementary enable signal $\overline{OE}$, and an output coupled to the gate of FET P7.

For disabling and providing a high impedance at the output node of the I/O driver 600, the I/O driver further comprises a FET P8 including a source coupled to the first voltage rail (e.g., Vdd), a drain coupled to the gates of pull-up FETs P1 and P2, and a gate configured to receive the enable signal OE. Similarly, the I/O driver 600 comprises a FET N8 including a drain coupled to the gates of the pull-down FETs N1 and N2, a source coupled to the second voltage rail (e.g., ground), and a gate configured to receive the complementary enable signal $\overline{OE}$.

Additionally, for disabling and providing a high impedance at the output node of the I/O driver 600, the I/O driver further comprises a switch SWP coupled in series with the feedback capacitor $C_{FP}$ between the output node and the gate of pull-up FET P1. The switch SWP is configured to close in response to the enable signal OE being asserted, and open in response to the enable signal OE being de-asserted. Additionally, the I/O driver 600 comprises a switch SWN coupled in series with the feedback capacitor $C_{FN}$ between the output node and the gate of the pull-down FET N1. The switch SWN is configured to close in response to the enable signal OE being asserted, and open in response to the enable signal OE being de-asserted. Further, the I/O driver 600 comprises a buffer 630 including an input coupled to the output node, and an output coupled to the control node Vr. The buffer 630 is enabled in response to the complementary enable signal $\overline{OE}$ being asserted, and disabled in response to the complementary enable signal $\overline{OE}$ being de-asserted.

The enabling and disabling of the I/O driver 600 operates as follows: When the enable signal OE is asserted (OE=high, $\overline{OE}$=low), the AND gate 612 and the OR gate 614 both output the same logic state as the input signal Do. Further, when the enable signal OE is asserted, the FETs P8 and N8 are turned off to allow the gate voltages $V_{GP}$ and $V_{GN}$ of pull-up FET P1 and pull-down FET N1 to reach their appropriate levels based on the input signal Do as previously discussed. Also, when the enable signal OE is asserted, the switches SWP and SWN are closed to couple feedback capacitors $C_{FP}$ and $C_{FN}$ between the output node and the respective gates of the pull-up FET P1 and pull-down FET N1 for controlling the slew rate of the output signal Vo as previously discussed. Additionally, the buffer 630 is disabled when the enable signal OE is asserted.

When the enable signal OE is de-asserted (OE=low, $\overline{OE}$=high), the AND gate 612 and the OR gate 614 output a low logic state and a high logic state, respectively, regardless of the state of the input signal Do. The low logic state at the output of the AND gate 612 turns off FET N6, and effectively disables the current source IP1. The high logic state at the output of the OR gate 614 turns off FET P7, and effectively disables the current source IN1.

Further, when the enable signal OE is de-asserted, the FETs P8 and N8 are turned on to couple the first voltage rail (e.g., Vdd) and the second voltage rail (e.g., ground) to the gates of pull-ups FET P1 and P2 and pull-down FETs N1 and N2, respectively. This turns off FETs P1, P2, N1, and N2. Also, when the enable signal OE is de-asserted, the switches SWP and SWN are opened. Accordingly, the turning off of the output FETs P1 and N1, and the decoupling of the feedback paths by opening the switches SWP and SWN, produces a high impedance at the output node of the I/O driver. As previously discussed, this allows one or more other devices to use the transmission line to which the output node is connected without the I/O driver affecting the use.

Additionally, when the enable signal OE is de-asserted, the buffer 630 is enabled so that the voltage Vr at the control node tracks the output voltage Vo when the transmission line connected to the output node is used by another device. This is done so that the replica circuit 620 is properly configured the next time the I/O driver is enabled. That is, during normal operations when the I/O driver 600 is enabled, the control voltage Vr and the output voltage Vo track each other. Thus, when the I/O driver 600 is disabled and configured to present a high impedance at the output node, it is desirable to have the control voltage Vr track the output voltage Vo driven by another device. Thus, when the I/O driver 600 is subsequently enabled, the control voltage Vr and the output voltage Vo are at substantially the same state for ensuring proper operation of the I/O driver 600 in response to the next transition of the input signal Do.

Figure 7:
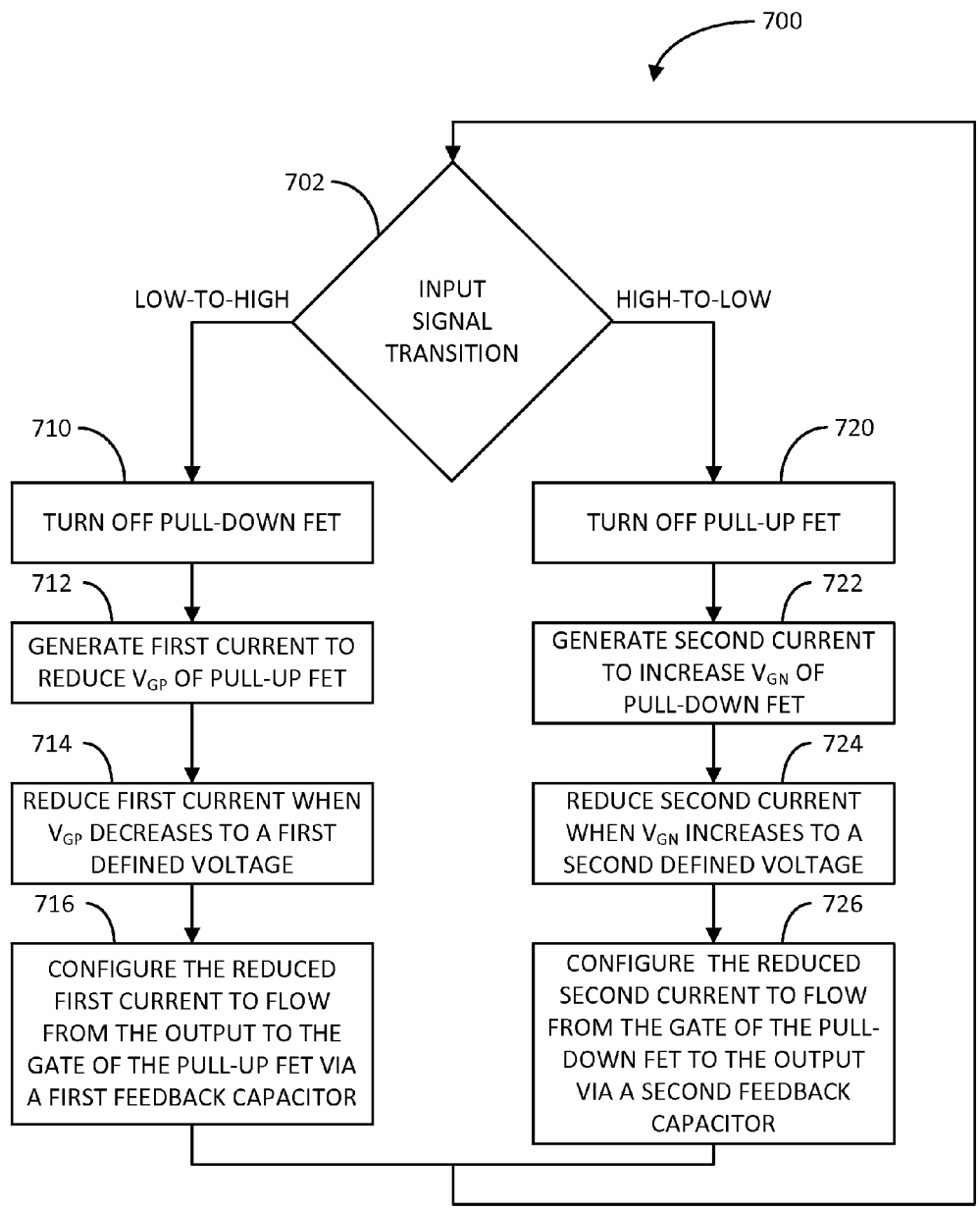
FIG. 7 illustrates a flow diagram of an exemplary method of generating an output signal in response to an input signal in accordance with another aspect of the disclosure.

FIG. 7 illustrates a flow diagram of an exemplary method 700 of generating an output signal Vo based on an input signal Do in accordance with another aspect of the disclosure. According to the method 700, a determination is made as to whether the input signal Do is transitioning from a low logic state to a high logic state, or vice-versa (block 702). For example, in the previous exemplary embodiments, the input interface circuit serves as an example of a means for determining whether the input signal Do is transitioning from a low logic state to a high logic state, or vice-versa.

If, in block 702, it is determined that the input signal Do is transitioning from a low logic state to a high logic state, the output pull-down FET is turned off (block 710). This is done to prevent a "shoot-thru" current through the output FETs by turning off the pull-down FET before the pull-up FET is turned on. Again, this gives an I/O driver implementing the method 700 a low power consumption attribute. In the previous exemplary embodiments, the input interface circuit and/or, more specifically, the FET N7 are examples of means for turning off the pull-down FET.

Continuing the scenario where the input signal Do has transitioned from a low logic state to a high logic state, a first current is generated to reduce the gate voltage $V_{GP}$ of the pull-up FET (block 712). This is done to turn on the pull-up FET in a defined manner. The defined manner may entail providing a relatively high current to quickly configure the pull-up FET to operate in the linear region to reduce the delay between the transition of the input signal Do and the corresponding transition of the output signal Vo. In the embodiment illustrated in FIG. 2A, the current source IP is an example of a means for generating the first current. In the embodiments illustrated in FIGS. 3, 4, and 6, the current sources IP1 and IP2 are examples of a means for generating the first current.

Once the gate voltage of the pull-up FET decreases to a defined voltage (e.g., a voltage that initially brings the operation of the pull-up FET into the linear region), the first current is reduced (block 714). This is done so that the output signal Vo transitions from a low logic state to a high logic state using a lower current to reduce EMI and reflections that may occur off of a transmission line coupled to the output node of an I/O driver. In the embodiment illustrated in FIG. 2A, the control circuit 220 is an example of a means for reducing the first current. In the embodiment illustrated in FIG. 2B, the combination of the replica circuit 320 and the IP2 control circuit 322 is an example of means for reducing the first current. In the embodiments illustrated in FIGS. 4-5, the respective combinations of the replica circuits 420 and 620 and the IP2 control circuits 422 and 622 are examples of means for reducing the first current.

Then, according to the method 700, the reduced first current is configured to flow from the output node to the gate of the pull-up FET by way of the feedback capacitor $C_{FP}$ (block 716). This is done so that the output voltage Vo transitions from a low logic state to a high logic state with a controlled slew rate given substantially by the reduced first current divided by the capacitance of the feedback capacitor $C_{FP}$. In the previous embodiments, the coupling of the feedback capacitor $C_{FP}$ between the output node and the gate of the pull-up FET is an example of a means for configuring the reduced first current to flow from the output node to the gate of the pull-up FET by way of the feedback capacitor $C_{FP}$. When the output signal Vo reaches the high logic state, the method 700 returns to block 702.

If instead, in block 702, it is determined that the input signal Do is transitioning from a high logic state to a low logic state, the output pull-up FET is turned off (block 720). Similarly, this is done to prevent a "shoot-thru" current through the output FETs by turning off the pull-up FET before the pull-down FET is turned on. Again, this gives an I/O driver implementing the method 700 a low power consumption attribute. In the previous exemplary embodiments, the input interface circuit and/or, more specifically, the FET P6 are examples of means for turning off the pull-up FET.

Continuing the scenario where the input signal Do has transitioned from a high logic state to a low logic state, a second current is generated to increase the gate voltage $V_{GN}$ of the pull-down FET (block 722). This is done to turn on the pull-down FET in a defined manner. The defined manner may entail providing an initial relatively high current to quickly configure the pull-up FET to operate in the linear region to reduce the delay between the transition of the input signal Do and the corresponding transition of the output signal Vo. In the embodiment illustrated in FIG. 2A, the current source IN is an example of a means for generating the second current. In the embodiments illustrated in FIGS. 3, 4, and 6, the current sources IN1 and IN2 are examples of a means for generating the second current.

Once the gate voltage of the pull-down FET increases to a defined voltage (e.g., a voltage that initially brings the operation of the pull-down FET into the linear region), the second current is reduced (block 724). This is done so that the output signal Vo transitions from a high logic state to a low logic state using a lower second current to reduce EMI and reflections that may occur off of a transmission line coupled to the output node of an I/O driver. In the embodiment illustrated in FIG. 2A, the control circuit 220 is an example of a means for reducing the second current. In the embodiment illustrated in FIG. 2B, the combination of the replica circuit 320 and the IN2 control circuit 324 is an example of a means for reducing the second current. In the embodiments illustrated in FIGS. 4-5, the respective combinations of the replica circuits 420 and 620 and the IN2 control circuits 424 and 624 are examples of means for reducing the second current.

Then, according to the method 700, the reduced second current is configured to flow from the gate of the pull-down FET to the output node by way of the feedback capacitor $C_{FN}$ (block 726). This is done so that the output voltage Vo transitions from a high logic state to a low logic state with a controlled slew rate given substantially by the reduced second current divided by the capacitance of the feedback capacitor $C_{FN}$. In the previous embodiments, the coupling of the feedback capacitor $C_{FN}$ between the output node and the gate of the pull-down FET is an example of a means for configuring the reduced second current to flow from the gate of the pull-down FET to the output node by way of the feedback capacitor $C_{FN}$. When the output signal Vo reaches the low logic state, the method 700 returns to block 702.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus configured to generate an output signal based on an input signal, comprising:
   a first field effect transistor (FET) including a first drain, a first source, and a first gate;
   a second FET including a second drain, a second source, and a second gate, wherein the first source, the first drain, the second drain, and the second source are coupled in series between a first voltage rail and a second voltage rail, wherein the output signal is generated at an output node between the first and second drains of the first and second FETs, respectively;
   a first feedback capacitor coupled between the first drain and the first gate of the first FET;
   a second feedback capacitor coupled between the second drain and the second gate of the second FET;
   a first current source coupled between the first gate of the first FET and the second voltage rail, wherein the first current source is configured to generate a first current in response to a high logic state of the input signal, the first current decreasing the first gate voltage to turn on the first FET in order to couple the first voltage rail to the output node;
   a second current source coupled between the first voltage rail and the second gate of the second FET, wherein the second current source is configured to generate a second current in response to a low logic state of the input signal, the second current increasing the second gate voltage to turn on the second FET in order to couple the output node to the second voltage rail; and
   a control circuit configured to:
      control the first current source based on a first gate voltage at the first gate of the first FET; and
      control the second current source based on a second gate voltage at the second gate of the second FET.

2. The apparatus of claim 1, wherein the control circuit comprises:
   a third FET including a third drain, a third source, and a third gate, wherein the third source is coupled to the first voltage rail, and wherein the third gate is coupled to the first gate of the first FET; and
   a fourth FET including a fourth drain, a fourth source, and a fourth gate, wherein the fourth gate is coupled to the second gate of the second FET, wherein the fourth source is coupled to the second voltage rail, wherein a control voltage for controlling the first and the second current sources is generated at a control node between the third and fourth drains of the third and fourth FETs, respectively.

3. The apparatus of claim 2, wherein the control circuit further comprises:
   a fifth FET including a fifth drain, a fifth source, and a fifth gate, wherein the fifth drain is coupled to the first gate of the first FET, and the first current source is coupled between the fifth source and the second voltage rail;
   a sixth FET including a sixth drain, a sixth source, and a sixth gate, wherein the sixth drain is coupled to the fifth gate, wherein the sixth source is coupled to the second voltage rail, and wherein the sixth gate is configured to receive the control voltage; and
   a seventh FET including a seventh drain, a seventh source, and a seventh gate, wherein the seventh drain is coupled to the fifth gate of the fifth FET, wherein the seventh source is configured to receive a voltage based on the input signal, and the seventh gate is configured to receive the control voltage.

4. The apparatus of claim 2, wherein the control circuit further comprises:
   a fifth FET including a fifth drain, a fifth source, and a fifth gate, wherein the fifth drain is coupled to the second gate of the second FET, and wherein the second current source is coupled between the first voltage rail and the fifth source;
   a sixth FET including a sixth drain, a sixth source, and a sixth gate, wherein the sixth source is coupled to the first voltage rail, wherein the sixth drain is coupled to the fifth gate, and wherein the sixth gate is configured to receive the control voltage; and
   a seventh FET including a seventh drain, a seventh source, and a seventh gate, wherein the seventh drain is coupled to the fifth gate of the fifth FET, wherein the seventh source is configured to receive a voltage based on the input signal, and the seventh gate is configured to receive the control voltage.

5. The apparatus of claim 2, wherein the third and fourth FETs are smaller than the first and second FETs, respectively.

6. The apparatus of claim 2, further comprising an enable/disable circuit configured to produce a high impedance at the output node in response to a de-asserted state of an enable signal.

7. The apparatus of claim 6, wherein the enable/disable circuit comprises a buffer configured to produce a first voltage at the control node substantially the same as a second voltage at the output node in response to the de-asserted state of the enable signal.

8. The apparatus of claim 1, wherein the control circuit is configured to decrease the first current in response to the first gate voltage decreasing to at or below a defined voltage.

9. The apparatus of claim 8, wherein the defined voltage is related to a threshold voltage of the first FET.

10. The apparatus of claim 1, wherein the control circuit is configured to decrease the second current in response to the second gate voltage increasing to at or above a defined voltage.

11. The apparatus of claim 10, wherein the defined voltage is related to a threshold voltage of the second FET.

12. The apparatus of claim 1, further comprising a third current source coupled between the first gate of the first FET and the second voltage rail, wherein the third current source is configured to generate a third current in response to a high logic state of the input signal, the third current decreasing the first gate voltage to turn on the first FET in order to couple the first voltage rail to the output node.

13. The apparatus of claim 12, wherein the control circuit is configured to substantially eliminate the first current in response to the first gate voltage decreasing to at or below a defined voltage.

14. The apparatus of claim 12, wherein a slew rate of the output voltage transitioning from a low logic state to a high logic state is a function of the third current over a capacitance of the first feedback capacitor.

15. The apparatus of claim 1, further comprising a third current source coupled between the first voltage rail and the second gate of the second FET, wherein the third current source is configured to generate a third current in response to a low logic state of the input signal, the third current increasing the second gate voltage to turn on the second FET in order to couple the output node to the second voltage rail.

16. The apparatus of claim 15, wherein the control circuit is configured to substantially eliminate the second current in response to the second gate voltage increasing to at or above a defined voltage.

17. The apparatus of claim 15, wherein a slew rate of the output voltage transitioning from a high logic state to a low logic state is a function of the third current over a capacitance of the second feedback capacitor.

18. The apparatus of claim 1, further comprising an enable/disable circuit configured to produce a high impedance at the output node in response to a de-asserted state of an enable signal, and produce the output voltage at the output node in response to an asserted state of the enable signal, wherein the enable/disable circuit comprises:
   a first switching device coupled between the first voltage rail and the first gate of the first FET, wherein the first switching device closes in response to the de-asserted state of the enable signal and opens in response to the asserted state of the enable signal;
   a second switching device coupled between the second gate of the second FET and the second voltage rail, wherein the second switching device closes in response to the de-asserted state of the enable signal and opens in response to the asserted state of the enable signal;
   a third switching device coupled in series with the first feedback capacitor between the output node and the gate of the first FET, wherein the third switching device opens in response to the de-asserted state of the enable signal and closes in response to the asserted state of the enable signal; and
   a fourth switching device coupled in series with the second feedback capacitor between the output node and the gate of the second FET, wherein the fourth switching device opens in response to the de-asserted state of the enable signal and closes in response to the asserted state of the enable signal.

19. The apparatus of claim 18, wherein the enable/disable circuit comprises:
   a first logic gate configured to enable the first current source in response to the high logic state of the input signal and the asserted state of the enable signal, and disable the first current source in response to the de-asserted state of the enable signal regardless of the state of the input signal; and
   a second logic gate configured to enable the second current source in response to the low logic state of the input signal and the asserted state of the enable signal, and disable the second current source in response to the de-asserted state of the enable signal regardless of the state of the input signal.

20. The apparatus of claim 1, further comprising an input interface circuit configured to:
   turn off the second FET before turning on the first FET in response to the input signal transitioning from the low logic state to the high logic state; and
   turn off the first FET before turning on the second FET in response to the input signal transitioning from the high logic state to the low logic state.

21. A method of generating an output signal at an output node based on an input signal, comprising:
   in response to the input signal transitioning from a low logic state to a high logic state, performing the following:
      enabling a first current source to generate a first current to decrease a first gate voltage of a first FET coupled between a first voltage rail and the output node;
      controlling the first current source to reduce the first current in response to the first gate voltage decreasing to a first defined voltage;
      routing the reduced first current from the output node to the first gate by way of a first feedback capacitor; and
      turning off a second FET coupled between the output node and a second voltage rail; and
   in response to the input signal transitioning from the high logic state to the low logic state, performing the following:
      enabling a second current source to generate a second current to increase a second gate voltage of the second FET;
      controlling the second current source to reduce the second current in response to the second gate voltage increasing to a second defined voltage;
      routing the reduced second current from the second gate to the output node by way of a second feedback capacitor; and
      turning off the first FET.

22. The method of claim 21, wherein controlling the first current comprises:
   enabling first and second current source components of the first current source in response to the input signal transitioning from the low logic state to the high logic state; and
   disabling the first current source component of the first current source in response to the decreasing to the first defined voltage.

23. The method of claim 22, further comprising configuring the reduced first current to set a defined slew rate of the output signal transitioning from the low logic state to the high logic state, wherein the defined slew rate is a function of the reduced first current and the capacitance of the first feedback capacitor.

24. The method of claim 21, wherein controlling the second current comprises:
   enabling first and second current source components of the second current source in response to the input signal transitioning from the high logic state to the low logic state; and
   disabling the first current source component of the second current source in response to the increasing to the second defined voltage.

25. The method of claim 22, further comprising configuring the reduced second current to set a defined slew rate of the output signal transitioning from the high logic state to the low logic state, wherein the defined slew rate is a function of the reduced second current and the capacitance of the second feedback capacitor.

26. An apparatus for generating an output signal at an output node based on an input signal, comprising:
   means for enabling a first current source to generate a first current to decrease a first gate voltage of a first FET coupled between a first voltage rail and the output node in response to the input signal transitioning from a low logic state to a high logic state;
   means for controlling the first current source to reduce the first current in response to the first gate voltage decreasing to a first defined voltage;
   means for routing the reduced first current from the output node to the first gate by way of a first feedback capacitor;

means for turning off a second FET coupled between the output node and a second voltage rail in response to the input signal transitioning from the low logic state to the high logic state;

means for enabling a second current source to generate a second current to increase a second gate voltage of the second FET in response to the input signal transitioning from the high logic state to the low logic state;

means for controlling the second current source to reduce the second current in response to the second gate voltage increasing to a second defined voltage;

means for routing the reduced second current from the second gate to the output node by way of a second feedback capacitor; and means for turning off the first FET in response to the input signal transitioning from the high logic state to the low logic state.

27. The apparatus of claim 26, wherein the means for controlling the first current comprises:

means for enabling first and second current source components of the first current source in response to the input signal transitioning from the low logic state to the high logic state; and means for disabling the first current source component of the first current source in response to the decreasing to the first defined voltage.

28. The apparatus of claim 27, wherein the means for controlling the first current comprises means for configuring the reduced first current to set a defined slew rate of the output signal transitioning from the low logic state to the high logic state, wherein the defined slew rate is a function of the reduced first current and the capacitance of the first feedback capacitor.

29. The apparatus of claim 26, wherein the means for controlling the second current comprises:

means for enabling first and second current source components of the second current source in response to the input signal transitioning from the high logic state to the low logic state; and means for disabling the first current source component of the second current source in response to the increasing to the second defined voltage.

30. The apparatus of claim 29, wherein the means for controlling the second current comprises means for configuring the reduced second to set a defined slew rate of the output signal transitioning from the high logic state to the low logic state, wherein the defined slew rate is a function of the reduced second current and the capacitance of the second feedback capacitor.

* * * * *